United States Patent
Jachmann et al.

(10) Patent No.: US 9,519,075 B2
(45) Date of Patent: Dec. 13, 2016

(54) FRONT TANGENTIAL ANTENNA FOR NUCLEAR MAGNETIC RESONANCE (NMR) WELL LOGGING

(71) Applicant: HALLIBURTON ENERGY SERVICES, INC., Houston, TX (US)

(72) Inventors: Rebecca Jachmann, Houston, TX (US); George David Goodman, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 14/436,857

(22) PCT Filed: May 6, 2014

(86) PCT No.: PCT/US2014/037027
§ 371 (c)(1),
(2) Date: Apr. 17, 2015

(87) PCT Pub. No.: WO2015/171124
PCT Pub. Date: Nov. 12, 2015

(65) Prior Publication Data
US 2016/0170070 A1 Jun. 16, 2016

(51) Int. Cl.
*G01V 3/00* (2006.01)
*G01V 3/32* (2006.01)
(Continued)

(52) U.S. Cl.
CPC ............. *G01V 3/32* (2013.01); *E21B 47/00* (2013.01); *E21B 47/122* (2013.01); *G01R 33/341* (2013.01); *G01R 33/3808* (2013.01)

(58) Field of Classification Search
CPC ........................................................ G01V 3/32
(Continued)

(56) References Cited

U.S. PATENT DOCUMENTS 5,680,044 A * 10/1997 McDougall ........ G01R 33/3808
324/303
6,060,882 A 5/2000 Doty
(Continued)

FOREIGN PATENT DOCUMENTS

EP         0687919       12/1995
WO         WO9942858     8/1999

OTHER PUBLICATIONS

International Search Report/Written Opinion for PCT/US2014/037027 filed May 6, 2014, issued Feb. 6, 2015 by KIPO; 10 pgs.
(Continued)

*Primary Examiner* — Louis Arana
(74) *Attorney, Agent, or Firm* — Benjamin Fite; Parker Justiss, P.C.

(57) ABSTRACT

The magnet and antenna assemblies of a logging tool can be arranged according to geometries optimal for concentric or eccentric well logging operations. In an example configuration, a logging tool can include a magnet, a magnetic core made of a magnetically permeable material, and an antenna. The outward path of the antenna can be positioned along a surface of the magnetically permeable magnetic core that faces away from the magnet, and the return path of the antenna can also be positioned along a surface that faces away from the magnet.

36 Claims, 13 Drawing Sheets

(51) Int. Cl.
*E21B 47/00* (2012.01)
*G01R 33/341* (2006.01)
*G01R 33/38* (2006.01)
*E21B 47/12* (2012.01)

(58) Field of Classification Search
USPC ......................................... 324/303, 318, 322
See application file for complete search history.

(56) References Cited

U.S. PATENT DOCUMENTS

| | | | |
|---|---|---|---|
| 6,348,792 B1 | 2/2002 | Beard et al. | |
| 6,373,248 B1 | 4/2002 | Poitzsch | |
| 6,445,180 B1 | 9/2002 | Reiderman et al. | |
| 6,452,388 B1 | 9/2002 | Reiderman et al. | |
| 6,489,763 B1 | 12/2002 | Goswami et al. | |
| 6,525,535 B2 | 2/2003 | Reiderman et al. | |
| 6,580,273 B2 | 6/2003 | Reiderman et al. | |
| 6,586,932 B1 * | 7/2003 | Taherian .......... | G01R 33/34046 324/303 |
| 6,720,765 B2 | 4/2004 | Edwards | |
| 6,781,371 B2 | 8/2004 | Taherian | |
| 7,012,426 B2 | 3/2006 | Edwards | |
| 7,235,970 B2 | 6/2007 | Kruspe et al. | |
| 7,295,005 B2 | 11/2007 | Edwards | |
| 7,916,092 B2 * | 3/2011 | Homan .................... | H01Q 1/04 343/719 |
| 8,330,459 B2 | 12/2012 | Kruspe | |
| 8,373,412 B2 | 2/2013 | Kruspe | |
| 8,471,562 B2 | 6/2013 | Knizhnik | |
| 2002/0153887 A1 | 10/2002 | Taicher | |
| 2004/0056658 A1 | 3/2004 | Masak et al. | |
| 2004/0222791 A1 | 11/2004 | Chen | |
| 2006/0173284 A1 | 8/2006 | Ackerman et al. | |
| 2009/0072825 A1 | 3/2009 | Prammer et al. | |
| 2013/0063142 A1 | 3/2013 | Hopper | |
| 2013/0093422 A1 | 4/2013 | Morys | |

OTHER PUBLICATIONS

Extended European Search Report issued in European Appiication No. 14850092.9, dated May 30, 2016.

* cited by examiner

Concentric

Eccentric

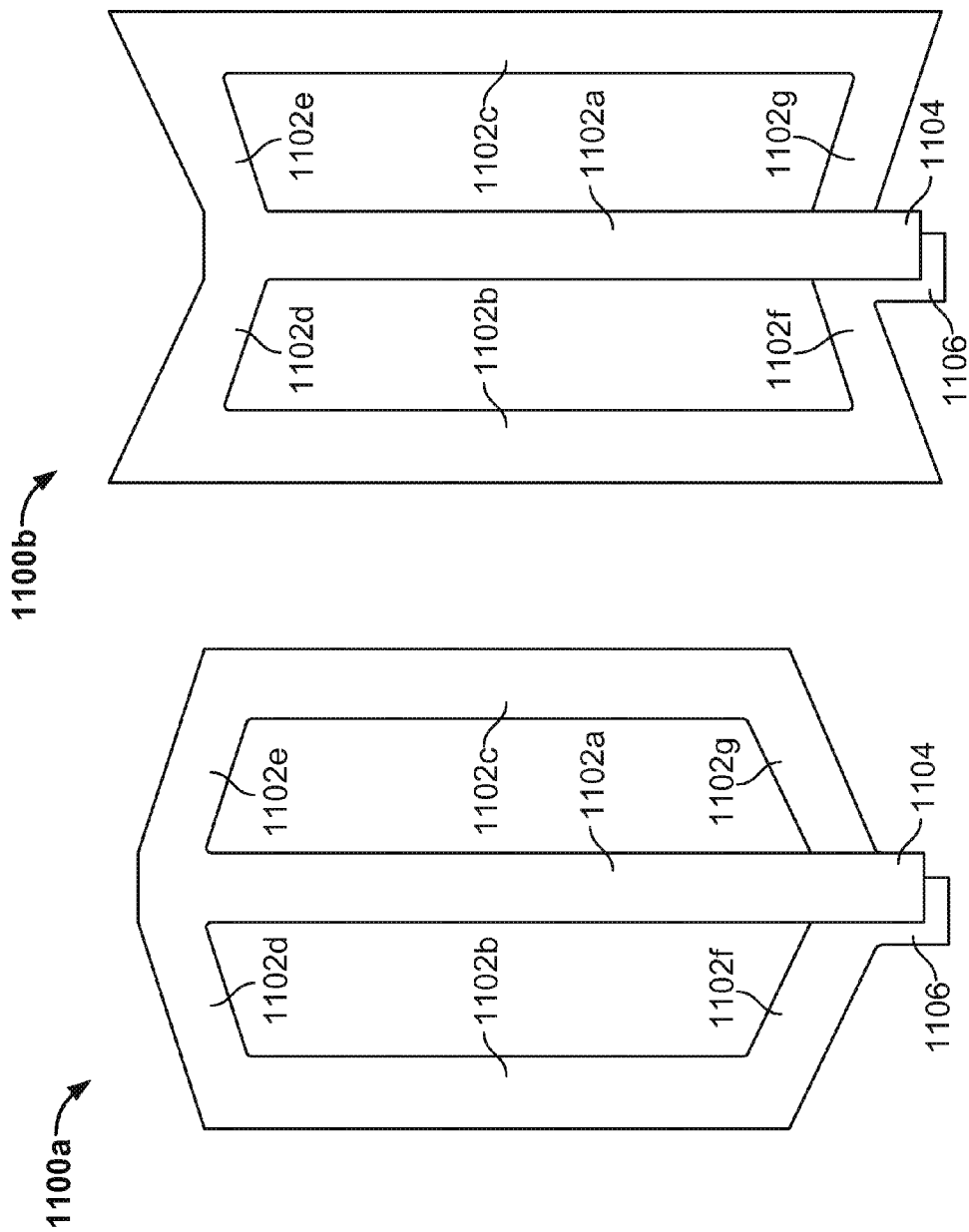

FRONT TANGENTIAL ANTENNA FOR NUCLEAR MAGNETIC RESONANCE (NMR) WELL LOGGING

CLAIMS OF PRIORITY

This application is a U.S. National Stage of International Application No. PCT/US/2014/037027, filed May 6, 2014.

TECHNICAL FIELD

This disclosure relates to nuclear magnetic resonance (NMR), and more particularly to NMR well logging systems having a front tangential antenna used to analyze subterranean environments.

BACKGROUND

In the field of logging (e.g., wireline logging, logging while drilling (LWD) and measurement while drilling (MWD)), nuclear magnetic resonance (NMR) tools have been used to explore the subsurface based on magnetic interactions with subsurface material. Some downhole NMR logging tools include a magnet assembly that produces a static magnetic field, and an antenna assembly that generates radio-frequency (RF) controlled signals and detects magnetic resonance phenomena in the subsurface material. Properties of the subsurface material can be identified from the detected phenomena.

DESCRIPTION OF DRAWINGS

FIGS. 11A-B are diagrams of other example antennas.

Like reference symbols in the various drawings indicate like elements.

DETAILED DESCRIPTION

Figure 1A:
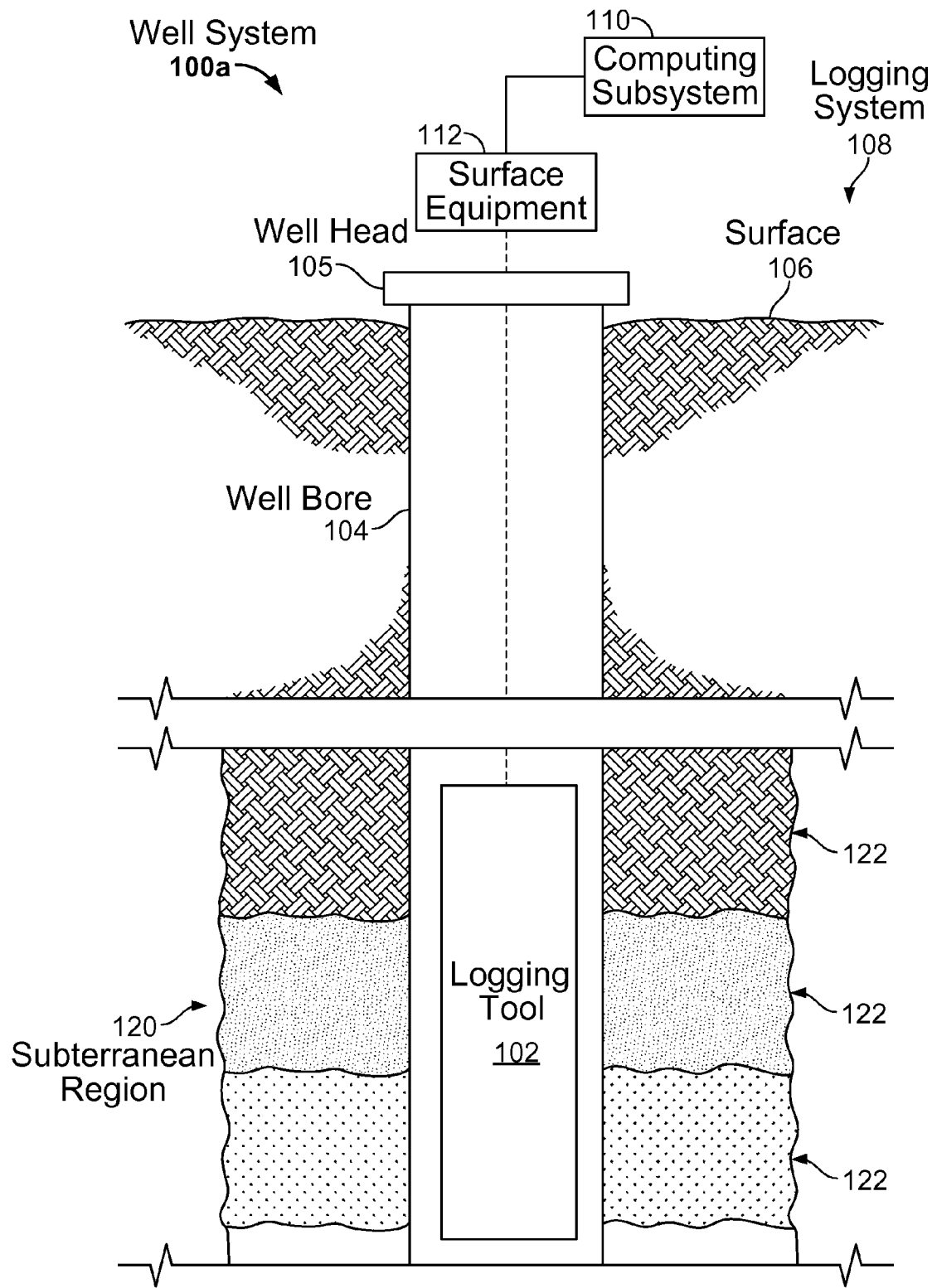
FIG. 1A is a diagram of an example well system.

FIG. 1A is a diagram of an example well system 100a. The example well system 100a includes an NMR logging system 108 and a subterranean region 120 beneath the ground surface 106. A well system can include additional or different features that are not shown in FIG. 1A. For example, the well system 100a may include additional drilling system components, wireline logging system components, etc.

The subterranean region 120 can include all or part of one or more subterranean formations or zones. The example subterranean region 120 shown in FIG. 1A includes multiple subsurface layers 122 and a wellbore 104 penetrated through the subsurface layers 122. The subsurface layers 122 can include sedimentary layers, rock layers, sand layers, or combinations of these other types of subsurface layers. One or more of the subsurface layers can contain fluids, such as brine, oil, gas, etc. Although the example wellbore 104 shown in FIG. 1A is a vertical wellbore, the NMR logging system 108 can be implemented in other wellbore orientations. For example, the NMR logging system 108 may be adapted for horizontal wellbores, slant wellbores, curved wellbores, vertical wellbores, or combinations of these.

The example NMR logging system 108 includes a logging tool 102, surface equipment 112, and a computing subsystem 110. In the example shown in FIG. 1A, the logging tool 102 is a downhole logging tool that operates while disposed in the wellbore 104. The example surface equipment 112 shown in FIG. 1A operates at or above the surface 106, for example, near the well head 105, to control the logging tool 102 and possibly other downhole equipment or other components of the well system 100. The example computing subsystem 110 can receive and analyze logging data from the logging tool 102. An NMR logging system can include additional or different features, and the features of an NMR logging system can be arranged and operated as represented in FIG. 1A or in another manner.

In some instances, all or part of the computing subsystem 110 can be implemented as a component of, or can be integrated with one or more components of, the surface equipment 112, the logging tool 102 or both. In some cases, the computing subsystem 110 can be implemented as one or more discrete computing system structures separate from the surface equipment 112 and the logging tool 102.

In some implementations, the computing subsystem 110 is embedded in the logging tool 102, and the computing subsystem 110 and the logging tool 102 can operate concurrently while disposed in the wellbore 104. For example, although the computing subsystem 110 is shown above the surface 106 in the example shown in FIG. 1A, all or part of the computing subsystem 110 may reside below the surface 106, for example, at or near the location of the logging tool 102.

The well system 100a can include communication or telemetry equipment that allow communication among the computing subsystem 110, the logging tool 102, and other components of the NMR logging system 108. For example, the components of the NMR logging system 108 can each include one or more transceivers or similar apparatus for wired or wireless data communication among the various components. For example, the NMR logging system 108 can include systems and apparatus for wireline telemetry, wired pipe telemetry, mud pulse telemetry, acoustic telemetry, electromagnetic telemetry, or a combination of these other types of telemetry. In some cases, the logging tool 102 receives commands, status signals, or other types of information from the computing subsystem 110 or another source. In some cases, the computing subsystem 110 receives logging data, status signals, or other types of information from the logging tool 102 or another source.

NMR logging operations can be performed in connection with various types of downhole operations at various stages in the lifetime of a well system. Structural attributes and components of the surface equipment 112 and logging tool 102 can be adapted for various types of NMR logging operations. For example, NMR logging may be performed during drilling operations, during wireline logging operations, or in other contexts. As such, the surface equipment 112 and the logging tool 102 may include, or may operate in connection with drilling equipment, wireline logging equipment, or other equipment for other types of operations.

In some implementations, the logging tool 102 includes a magnet assembly, which may be arranged to create a static magnetic field in a volume of interest. The logging tool 102 can also include one or more antenna assemblies. The antenna assemblies can produce an excitation in a subterranean volume and acquire a response from the volume by quadrature detection.

Figure 1B:
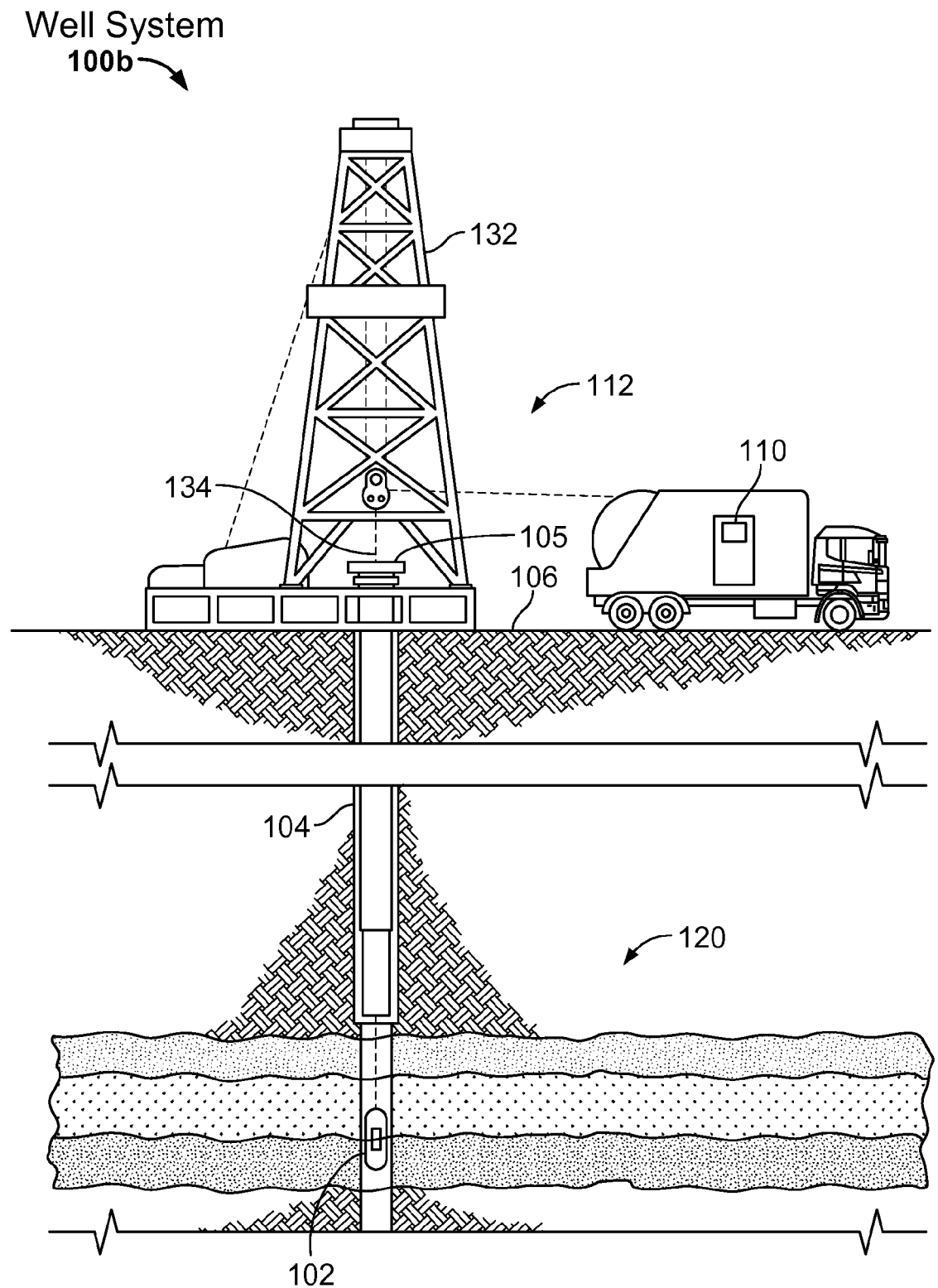
FIG. 1B is a diagram of an example well system that includes an NMR logging tool in a wireline logging environment.

In some examples, NMR logging operations are performed during wireline logging operations. FIG. 1B shows an example well system 100b that includes the NMR logging tool 102 in a wireline logging environment. In some example wireline logging operations, surface equipment 112 includes a platform above the surface 106. The platform of surface equipment 112 is equipped with a derrick 132 that supports a wireline cable 134 that extends into the wellbore 104. Wireline logging operations can be performed, for example, after a drilling string is removed from the wellbore 104, to allow the wireline logging tool 102 to be lowered by wireline or logging cable into the wellbore 104.

Figure 1C:
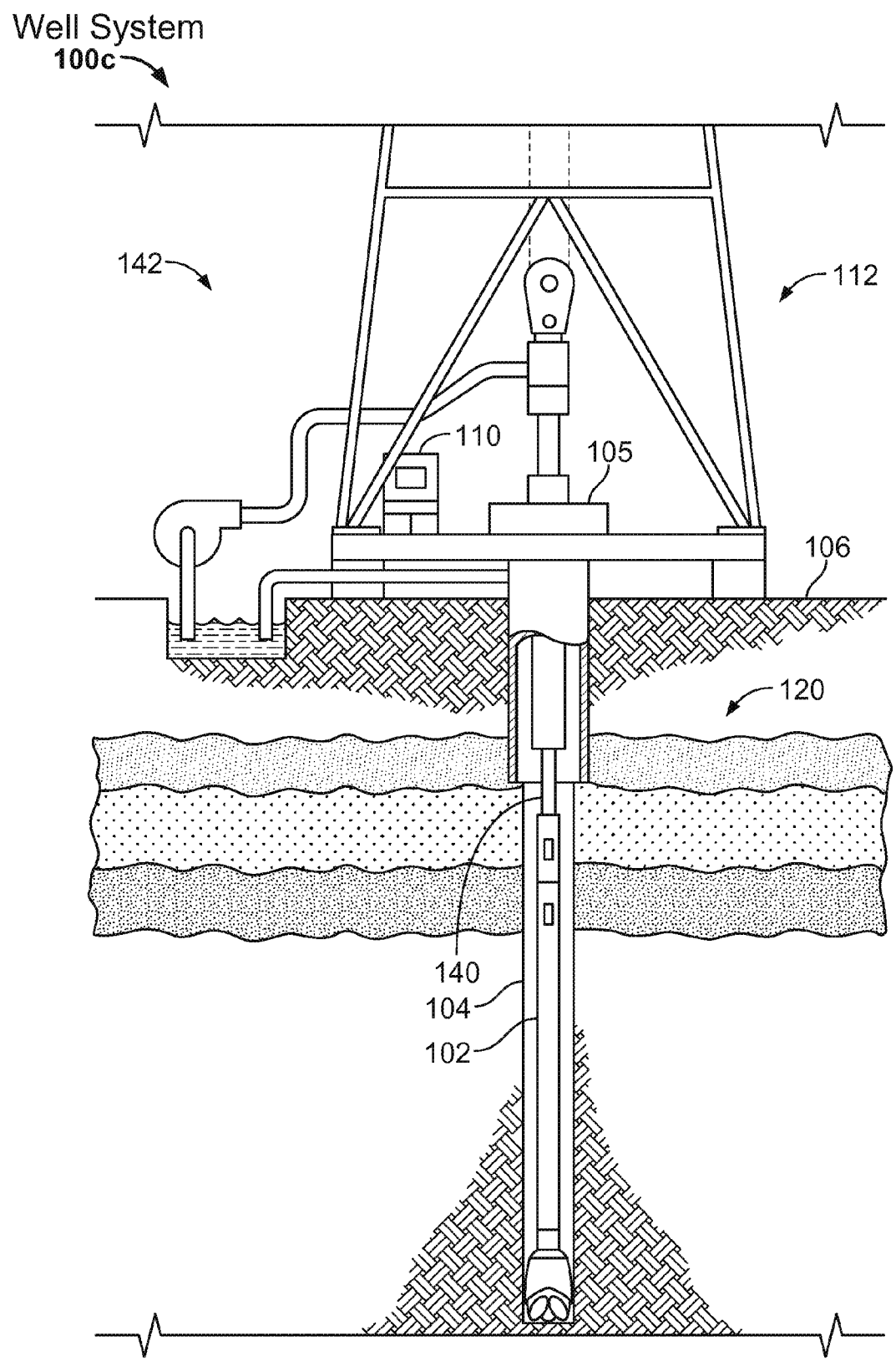
FIG. 1C is a diagram of an example well system that includes an NMR logging tool in a logging while drilling (LWD) environment.

In some examples, NMR logging operations are performed during drilling operations. FIG. 1C shows an example well system 100c that includes the NMR logging tool 102 in a logging while drilling (LWD) environment. Drilling is commonly carried out using a string of drill pipes connected together to form a drill string 140 that is lowered through a rotary table into the wellbore 104. In some cases, a drilling rig 142 at the surface 106 supports the drill string 140, as the drill string 140 is operated to drill a wellbore penetrating the subterranean region 120. The drill string 140 may include, for example, a kelly, drill pipe, a bottom hole assembly, and other components. The bottom hole assembly on the drill string may include drill collars, drill bits, the logging tool 102, and other components. The logging tools may include measuring while drilling (MWD) tools, LWD tools, and others.

In some example implementations, the logging tool 102 includes an NMR tool for obtaining NMR measurements from the subterranean region 120. As shown, for example, in FIG. 1B, the logging tool 102 can be suspended in the wellbore 104 by a coiled tubing, wireline cable, or another structure that connects the tool to a surface control unit or other components of the surface equipment 112. In some example implementations, the logging tool 102 is lowered to the bottom of a region of interest and subsequently pulled upward (e.g., at a substantially constant speed) through the region of interest. As shown, for example, in FIG. 1C, the logging tool 102 can be deployed in the wellbore 104 on jointed drill pipe, hard wired drill pipe, or other deployment hardware. In some example implementations, the logging tool 102 collects data during drilling operations as it moves downward through the region of interest during drilling operations. In some example implementations, the logging tool 102 collects data while the drilling string 140 is moving, for example, while it is being tripped in or tripped out of the wellbore 104.

In some example implementations, the logging tool 102 collects data at discrete logging points in the wellbore 104. For example, the logging tool 102 can move upward or downward incrementally to each logging point at a series of depths in the wellbore 104. At each logging point, instruments in the logging tool 102 perform measurements on the subterranean region 120. The measurement data can be communicated to the computing subsystem 110 for storage, processing, and analysis. Such data may be gathered and analyzed during drilling operations (e.g., during logging while drilling (LWD) operations), during wireline logging operations, or during other types of activities. In some implementations, measurement data can be stored by logging tool 102 (e.g., in a data storage module) for future retrieval and analysis, for example after logging tool 102 is removed from the wellbore. 104.

The computing subsystem 110 can receive and analyze the measurement data from the logging tool 102 to detect properties of various subsurface layers 122. For example, the computing subsystem 110 can identify the density, material content, or other properties of the subsurface layers 122 based on the NMR measurements acquired by the logging tool 102 in the wellbore 104.

In an example downhole NMR experiment, a static magnetic field, $B_0$, and second radio frequency (RF) magnetic field, $B_1$, are used to create and manipulate nuclear magnetization. NMR experiments can give insight to a variety of properties of the downhole environment, for example diffusion, viscosity, porosity (i.e., amount of fluid in an underground formation), and permeability, among others. These properties can be measured from the NMR response, which measures the $T_1$ recovery time, $T_2$ decay time, and $T_{rho}$ relaxation time of the magnetization.

Figure 2A:
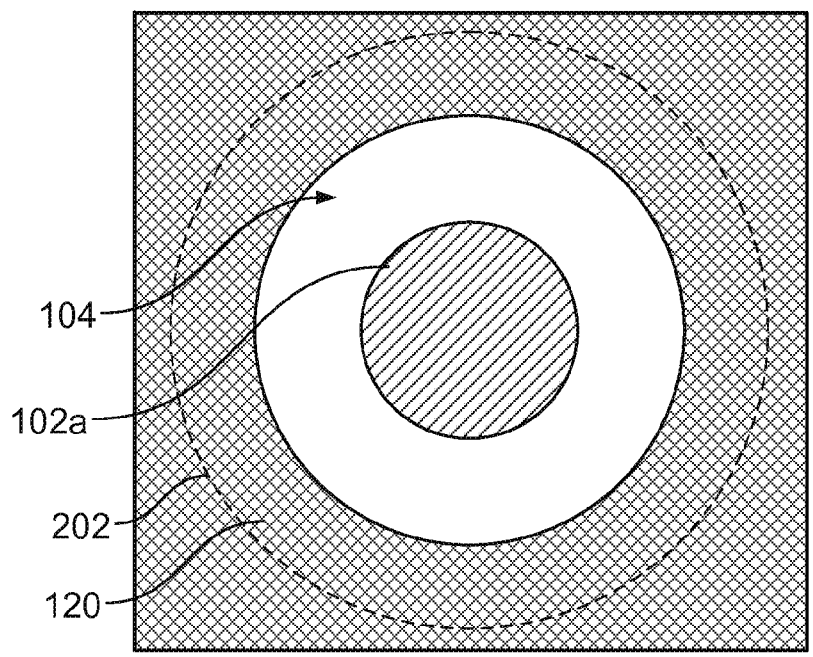
FIGS. 2A-B are diagrams of example concentric and eccentric well logging systems.

Well logging is often classified into two categories: concentric and eccentric. Concentric well logging (also referred to as "centralized" well logging) can be used to omnidirectionally analyze the environment surrounding a logging tool. For example, FIG. 2A depicts an axial cross-section of an axially-extending concentric logging tool 102a. Logging tool 102a is positioned within a wellbore 104, such that the axis of extension of logging tool 102 is approximately parallel to the extension of the wellbore 104. In concentric well logging, the logging tool 102a can be positioned centrally within the wellbore 104, and can omnidirectionally analyze the subterranean region 120 that surrounds the logging tool 102a. As an example, logging tool 102a can be used to analyze the portion enclosed by dotted line 202.

Figure 2B:
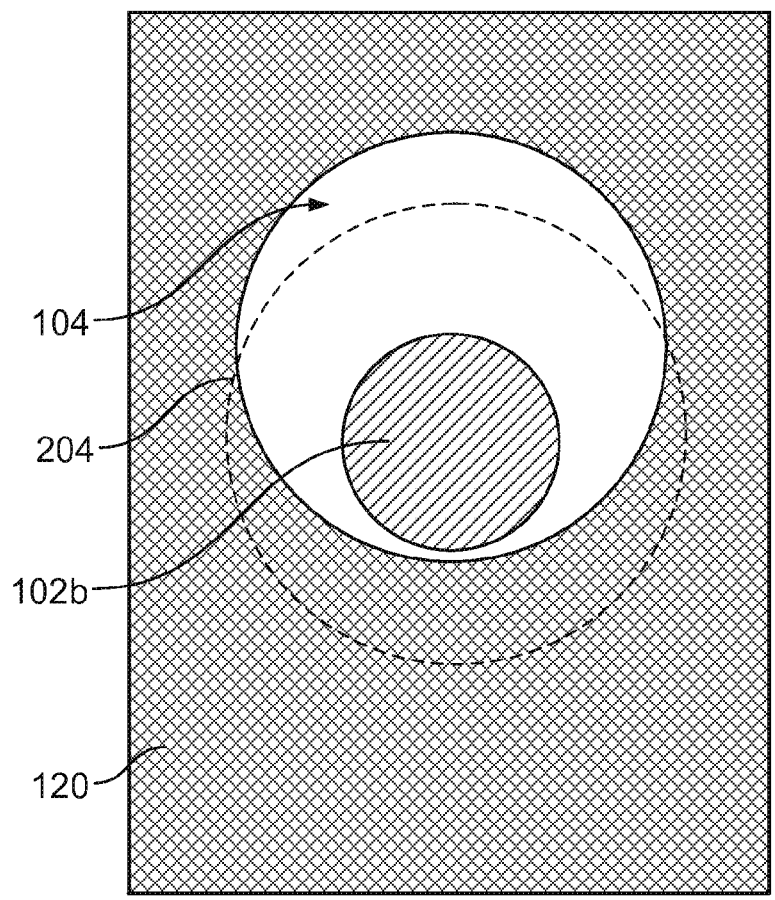

In contrast, eccentric well logging (also referred to as "side-looking" well logging) can be used to analyze a directionally-dependent portion of the environment surrounding a logging tool. For example, FIG. 2B depicts an axial cross-section of an axially-extending eccentric logging tool 102b. Logging tool 102b is also positioned within a wellbore 104, such that the axis of extension of logging tool 102 is approximately parallel to the extension of the wellbore 104. In eccentric well logging, a logging tool 102b can be positioned away from the center of the wellbore 104, such that it analyzes a directionally-dependent portion of the subterranean region 120 that surrounds the logging tool 102b. As an example, logging tool 102b can be used to analyze the portion enclosed by dotted line 204. However, with the RF field decay towards the back of the tool, the majority of the signal in that region will be from the formation in front of the tool, and minimally from the mud in the borehole.

The magnet and antenna assembles of logging tool 102 can be arranged according to different geometries to better suit concentric or eccentric well logging operations. For example, in eccentric well logging applications, a logging tool 102 can have magnet and antenna assemblies arranged about a core of "soft" magnetically permeable material. In some implementations, this magnetically permeable material can have a relative magnetic permeability in a range from about 2 to 200 (i.e., have a permeability between 2 and 200 times that of free space). Example materials include polymer ferrite (e.g., having a relative permeability in a range from about 2 to 20), and molypermalloy powder (MPP) (e.g., having a relative permeability in a range from about 10 to 200). In some implementations, the magnetically permeable material can be a material that has a relative magnetic permeability of greater than 200. For example, in some implementations, these materials can include "soft" ferrite materials such as 3F3. A permeability of about 9 to 20 might be preferable in certain circumstances, for example to promise a compromise between magneto-acoustic ringing and magnetic permeability.

Figure 3:
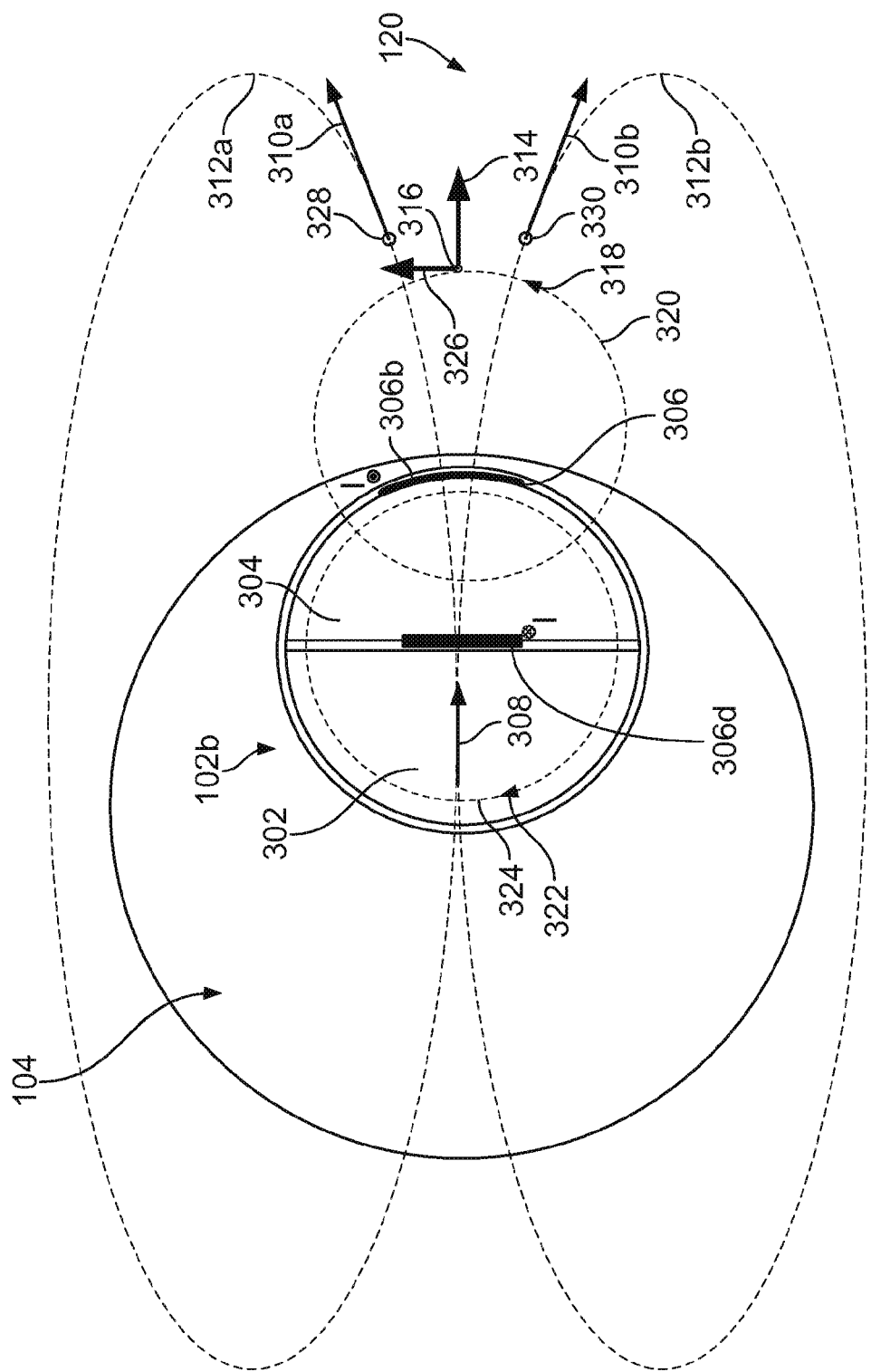
FIG. 3 is a diagram of an example logging tool positioned within a wellbore.

This magnetically permeable material can be positioned in a manner that decreases the magnetic flux in the proximity of the magnet due to the antenna, thus dampening eddy currents and reducing ringing artifacts from the magnet by directionally focusing the antenna's RF field $B_1$ outward from the tool. An example arrangement for a logging tool and its corresponding magnetic flux is shown in FIG. 3. In the following example, the spatial relationship between the logging tool and its induced magnetic flux is exaggerated, and is not drawn to scale. FIG. 3 depicts an axial cross-section of an axially-extending eccentric logging tool 102b positioned within a wellbore 104, and used to directionally analyze the subterranean region 120 that surrounds the logging tool 102b. Logging tool 102b includes a radially arranged magnet 302, a magnetic core 304 made of a magnetically permeable material, and tangentially arranged antenna 306.

Magnet 302 is used to create the magnetic field $B_0$ in an NMR experiment. Magnet 302 has remnant field 308 that extends radially towards magnetically permeable magnetic core 304, and induces magnetic flux, depicted in FIG. 3. This magnetic flux is depicted at particular points 328 and 330 as arrows 310a and 310b, respectively, positioned along dotted lines 312a and 312b, respectively. This magnetic flux induces magnetization, in all regions containing magnetic spin, in the direction of the magnetic field. For example, the point 316 within the subterranean region 120 has magnetization in the direction of arrow 314. This magnetization is proportional to the static field, $B_0$, and is relatively small.

In some implementations, the magnet 302 is a permanent magnet (e.g., Samarium cobalt, Alnico, ferrite, or other rare earth magnets). In other implementations, the magnet 302 is an electromagnet (e.g., a solenoid composed of materials such as copper, silver, and gold). Magnet 302 can induce magnetic fields of varying strengths. For example, in some implementations, at the zone of interest, the strength of the induced magnetic field can be approximately 0.0025 Tesla to 1.5 Tesla. Magnet 302 may be of various shapes. In this example configuration, magnet 302 is generally a half cylinder with a semi-circular axial cross section. In cross section, magnet 302 is defined by an outer semicircular arc faces outward from the logging 102b, and an inner edge that faces magnetic core 304. In some implementations, magnet 302 may be of other shapes. For instance, in some implementations, magnet 302 can have a cross section that includes rectangular, square, circular, elliptical, polygonal, or irregular elements. In some implementations, operation of the magnet 302 can be controlled by an electronic controller module, for example an electronic processor in computing subsystem 110.

Magnetic core 304 is made of a magnetically permeable material. For example, in some implementations, magnetic core 304 is made of (ferrotron, ferrite, Molypermalloy, or other permeable magnetic materials). Magnetic core 304 can made of materials that vary in relative permeability. For example, in some implementations, magnetic core 304 can be made of permeable magnetic materials with relative permeability greater than 5. Magnetic core 304 may be of various shapes. In this example configuration, magnetic core 304 has a generally semi-circular axial cross section, and is generally symmetrical with magnet 302. In cross section, magnetic core 304 is defined by an outer semicircular arc faces outward from the logging 102b, and an inner edge that faces magnet 302. In some implementations, magnetic core 304 may be of other shapes. For instance, in some implementations, magnet 302 can have a cross section that includes rectangular, square, circular, elliptical, polygonal, or irregular elements. In some implementations, magnetic core 304 is not symmetrical to magnet 302, and may have a different shape or volume.

Figure 4:
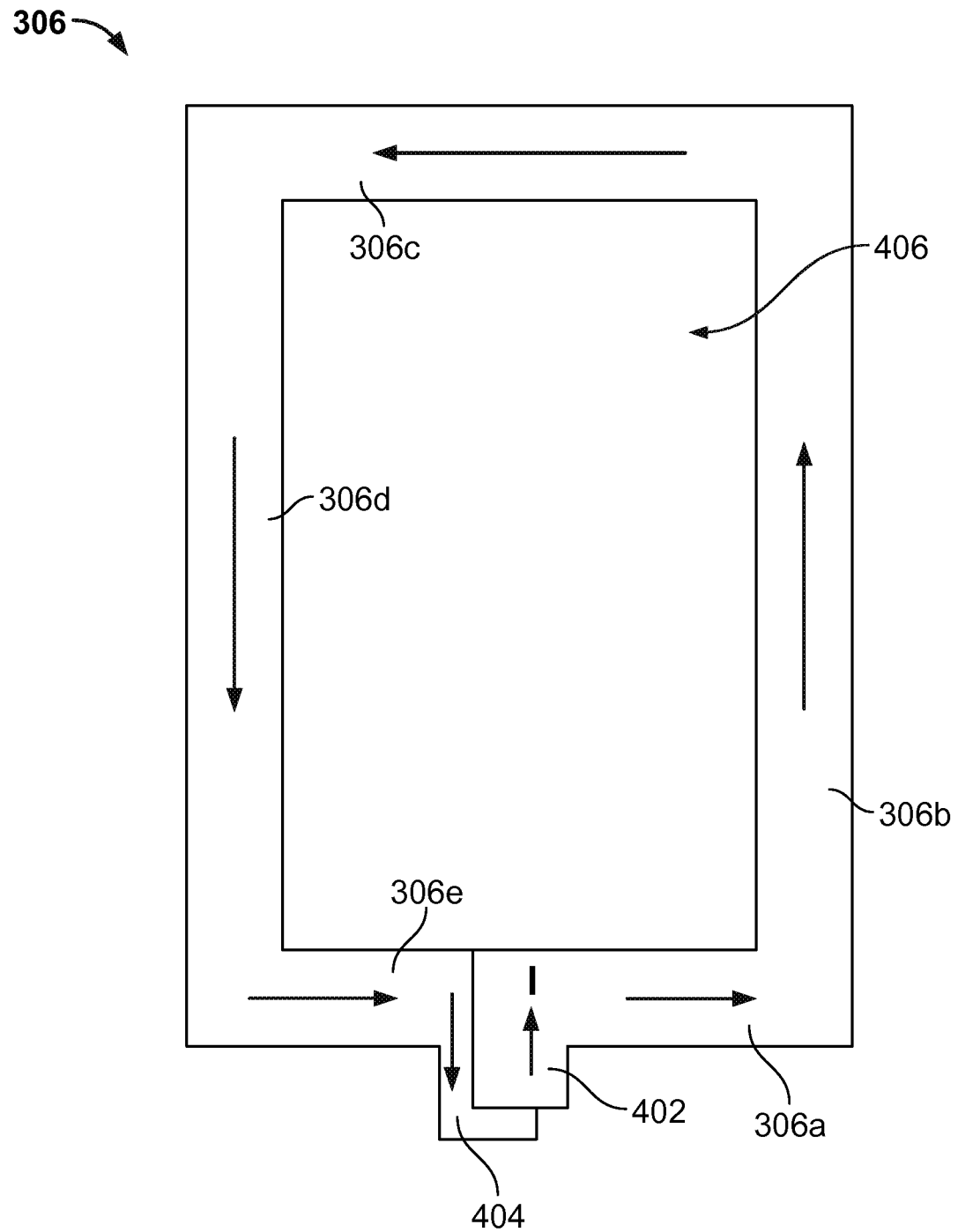
FIG. 4 is a diagram of an example antenna.

Antenna 306 is a path of electrically conductive material positioned along magnetic core 304. For example, in some implementations, antenna 306 can be made of electrically conductive metals, such as copper, aluminum, gold, silver, or high temperature super conductors. Antenna 306 carries a current I in order to induce an RF magnetic field $B_1$ in an NMR experiment, and is used to measure the NMR signal in response to the induced fields. In some implementations, this applied current can be controlled by an electronic controller module, for example an electronic processor in computing subsystem 110. Antenna 306 can be of various shapes. For instance, in some implementations, antenna 306 can define a loop. An example antenna 306 is shown in FIG. 3, illustrating a cross-sectional view of the antenna 306 positioned within logging tool 102b, and FIG. 4, illustrating a flattened view of antenna 306. Antenna 306 can include an input lead 402, where a current I can be applied to the antenna 306, and an output lead 404, where the current I can flow out of the antenna 306. Between the input and output leads, antenna 306 defines a conductive path. For example, antenna 306 can include a first segment 306a that extends radially from input lead 402, a second segment 306b that extends parallel to the axis of tool 102b along the outward-facing edge of magnetic core 304, a third segment 306c that extends radially, a fourth segment 306d that extends parallel to the axis of tool 102b along an inward-facing edge of magnetic core 304, and a fifth segments 306e that connects to the output lead 404, forming a loop 406. In some implementations, antenna 306 can be positioned on magnetic core 304 such that it directly contacts magnetic core 304. For example, antenna 306 can secured directly onto magnetic core 304 using an adhesive material or securing element (e.g., a bracket, clip, pin, or other suitable securing element). In some implementations, antenna 306 may be positioned slightly distant from magnetic core 304, such that it does not directly contact magnetic core 304. For example, antenna 306 and magnetic core 304 can be separated by a layer of relatively non-conductive material (e.g., a layer of adhesive material such as glue), a holder or bracket made of a relatively non-conductive material (e.g., a holder made out of a plastic or polymer, such as polyether ether ketone (PEEK)), or air.

Referring back to FIG. 3, when a current I is applied to antenna 306 at input lead 402, current I flows outward from input lead 402 in a first direction (depicted in FIG. 3 as flowing out of the page) along segment 306b, inducing magnetic flux (depicted as arrowhead 318 positioned along dotted line 320). Current I also returns to output lead 402 by flowing in a second direction (depicted in FIG. 3 as flowing into the page) along segment 306d, inducing magnetic flux (depicted as arrowhead 322 positioned along dotted line 324). At point 316, the net RF magnetic flux induced by the current I in the antenna points tangentially to the tool (represented by arrow 326), and is perpendicular to the net magnetic field $B_0$ induced by the magnet (represented by arrow 314). The RF magnetic field induced by the antenna is called $B_1$ in an NMR experiment.

In a similar manner, antenna 306 can be used to detect changes in magnetism, such as nuclear magnetization, in the surrounding environment. For instance, in an example NMR experiment, nuclear magnetization at point 316 is allowed to polarize such that it initially aligns with the $B_0$ field, is tipped around the $B_1$ field, and relaxes back towards the $B_0$ field when the $B_1$ field is removed. Antenna 306 can be used to measure the nuclear magnetization precession through electromagnetic induction, and can be used to produce electric signals in response to the changing nuclear magnetism.

In this example configuration, the "outward path" of antenna 306 (i.e., the segment 306a that directs current I outward from input lead 402) is positioned along a surface of magnetic core 304 opposite from magnet 302, while the "return path" of the antenna 306 (i.e., segment 306d that returns current I back to the output lead 404) is positioned along a surface of magnetic core 304 that faces towards magnet 302. This configuration is known as an "inside return."

While antenna 306 is described has having a single loop wrapped around magnetic core 304, antennas can define paths of different shapes, and can be arranged differently with respect to magnetic core 304. For example, referring to FIG. 5 and FIG. 6, in some implementations, a logging tool 102b includes a radially-arranged magnet 302, a magnetic core 304 made of a magnetically permeable material, and tangentially arranged antenna 502.

As before, magnet 302 can be used to induce the magnetic field $B_0$ in an NMR experiment. Magnet 302 has a remnant field 308 that extends radially towards magnetically permeable magnetic core 304, and creates lines of magnetic flux, partially depicted in FIG. 5 as arrows 310a and 310b extending from points 328 and 330, respectively, positioned along dotted lines 312a and 312b, respectively. As before, magnetic flux results in a net magnetization, in all regions with magnetic spin, in the direction of the magnetic field. For example, the point 316 within the subterranean region 120 has magnetization in the direction of arrow 314.

Figure 5:
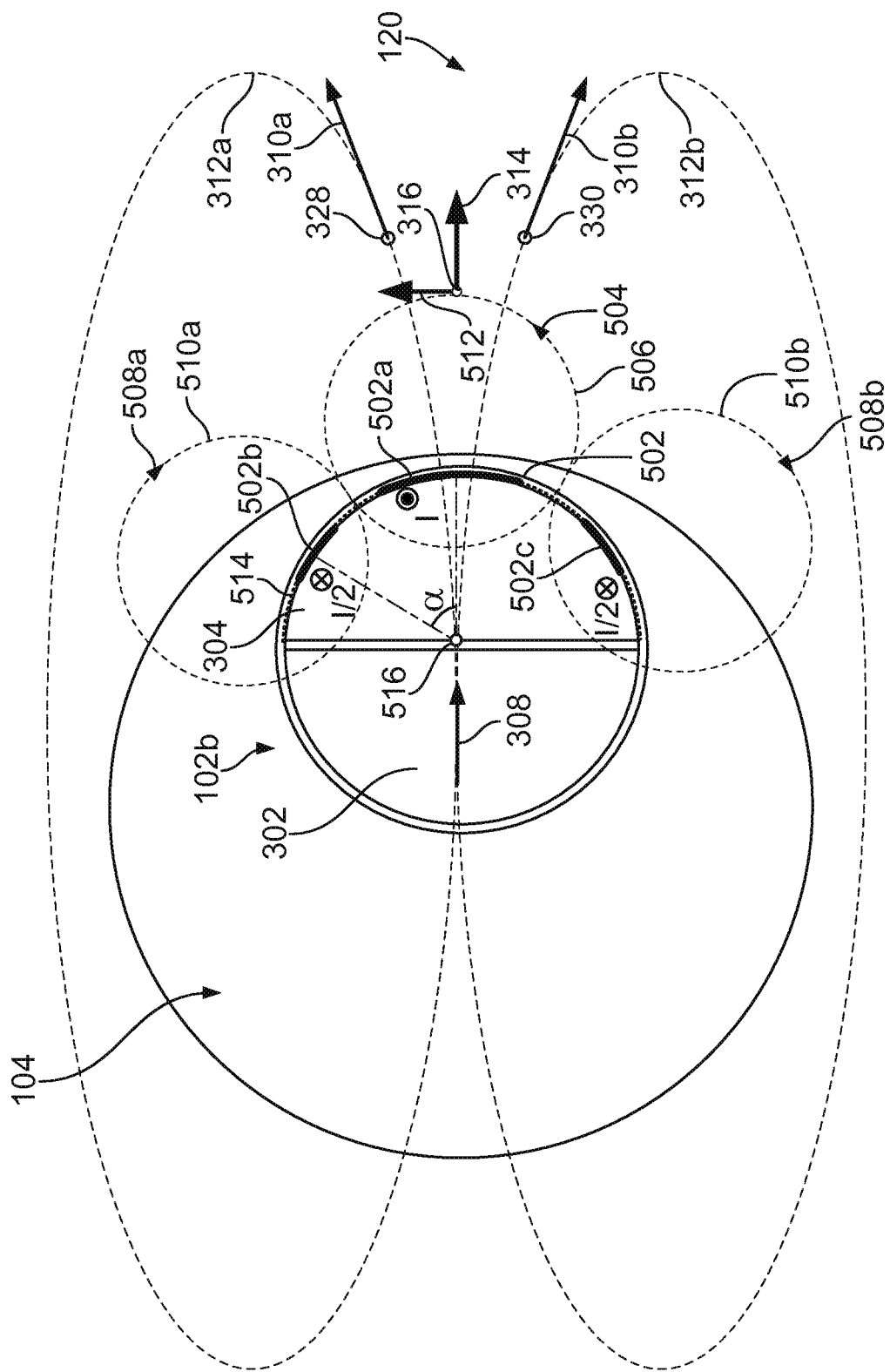
FIG. 5 is a diagram of another example logging tool positioned within a wellbore.
Figure 6:
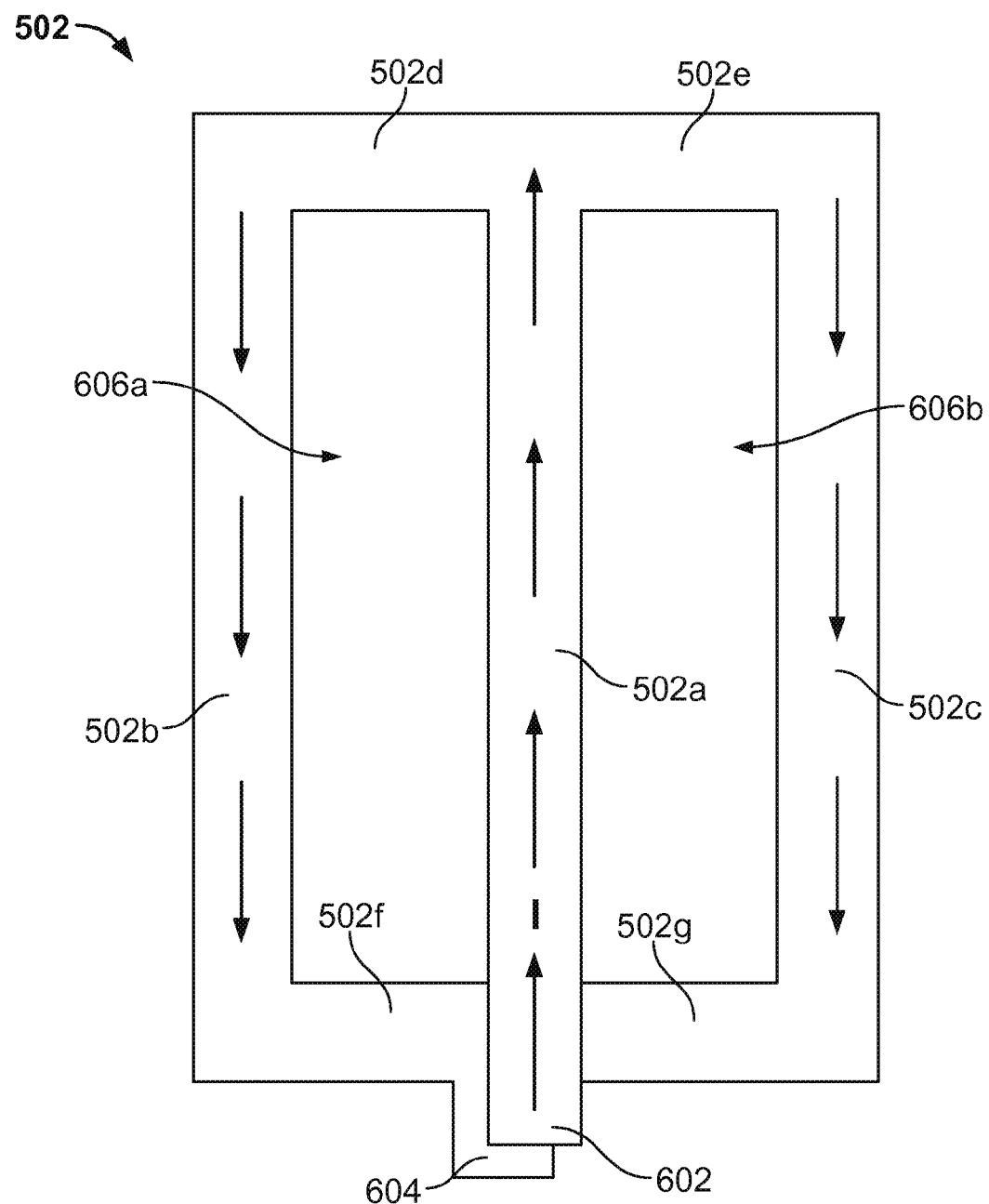
FIG. 6 is a diagram of another example antenna.

Antenna 502 is a path of electrically conductive material positioned along magnetic core 304. As with antenna 306, antenna 502 carries a current I in order to induce an RF magnetic field $B_1$ in an NMR experiment, and is used to measure the NMR signal in response to the fluctuating nuclear magnetization. In some implementations, antenna 502 can define multiple loops. An example antenna 502 is shown in FIG. 5, illustrating a cross-sectional view of the antenna 502 positioned within logging tool 102b, and FIG. 6, illustrating a flattened view of antenna 502. Antenna 502 can include an input lead 602, where a current I can be applied to the antenna 502, and an output lead 604, where the current I can flow out of the antenna 502. Between the input and output leads, antenna 502 defines a conductive path. For example, antenna 502 can include a common segment 502a that extends parallel to the axis of tool 102b from input lead 604, two segments 502b-c that extend parallel to common segment 502a on each side of common segment 502a, two segments 502d-e that connect common segment 502a to segments 502b-c, respectively, and two segments 502f-g that connect segments 502d-c, respectively, to output lead 604. These segments 502a-g form two symmetric loops 606a and 606b. As with antenna 306, in some implementations, antenna 502 can be positioned on magnetic core 304 such that it directly contacts magnetic core 304. For example, antenna 502 can secured directly onto magnetic core 304 using an adhesive material or securing element (e.g., a bracket, clip, pin, or other suitable securing element). In some implementations, antenna 502 may be positioned slightly distant from magnetic core 304, such that it does not directly contact magnetic core 304. For example, antenna 306 and magnetic core 304 can be separated by a layer of relatively non-conductive material (e.g., a layer of adhesive material such as glue), a holder or bracket made of a relatively non-conductive material (e.g., a holder made out of a plastic or polymer, such as polyether ether ketone (PEEK)), or air.

In this example configuration, antenna 502 is positioned on a notional arc 514 defined by the outer semi-circular periphery of magnetic core 304. The common segment 502a extends axially from the center of the arc 514. For example, in FIG. 5, segment 502a extend from arc 514 in a direction parallel to the axis of tool 102b (i.e., into the page and out from the page). Segments 502b-c extend axially from the arc 514 from positions distant from common segment 502a. For example, in FIG. 5, segments 502b-c each extend from arc 514 in a direction parallel to the axis of tool 102b (i.e., into the page and out from the page). In this example, segments 502b-c are separated from the common segment 502a by an angular distance a. Angular distance a can differ, depending on the implementation. For example, in some implementations, angular distance a can be approximately 80 to 85 degrees relative to the focus 516 of the arc 514. In some implementations, segments 502b-c can be separated by common segment 502a by other angular distances. For example, in some implementations, angular distance a can be approximately 20 to 120 degrees. The angular distances α between segments 502b-c and common segment 502a can also vary based on the angular distance covered by the segments 502a-c themselves. For example, in some implementations, the angular distances α can vary depending on the thickness of segments 502a-c.

Referring back to FIG. 5, when a current I is applied to antenna 502 at input lead 602, current I flows outward from input lead 602 in a first direction (depicted in FIG. 5 as flowing out of the page) along common segment 502a, inducing magnetic flux (depicted as arrowhead 504 positioned along dotted line 506). Current I also returns to output lead 604 by flowing in a second direction (depicted in FIG. 5 as flowing into the page) along segments 502b-c, with the current I divided between the two segments 502b-c. This current I/2 in each segment 502b-c induces magnetic flux (depicted as arrowheads 508a and 508b positioned along dotted lines 510a and 510b, respectively), the magnetic field of the antenna being known as $B_1$. At point 316, the net RF magnetic flux induced by the current I in the antenna points tangentially to the tool (represented by arrow 512), and is perpendicular to the net magnetic field $B_0$ induced by the magnet (represented by arrow 314). In a similar manner, antenna 602 can also be used to detect changes in magnetism in the surrounding environment. For instance, in an example NMR experiment, nuclear magnetization at point 316 is allowed time to polarize such that it initially aligns with the $B_0$ field, then is tipped around the $B_1$ field, and when the $B_1$ field is removed, relaxes back towards the $B_0$ field. Antenna 502 can be used to measure the NMR precession through electromagnetic induction by producing electric signals in response to the changing nuclear magnetism. As above, the spatial relationship between the logging tool and its induced magnetic flux is exaggerated, and is not drawn to scale.

In this example configuration, the "outward path" of antenna 502 (i.e., the common segment 502a that directs current I outward from input lead 602) is positioned along a surface of magnetic core 304 that faces away from magnet 302, and the "return path" of the antenna 502 (i.e., the segments 502b-c that return current I back to the output lead 604) is also positioned along a surface that faces away from magnet 302. This configuration is known as a "front return."

In some cases, a tool with a front return antenna arrangement can provide various benefits over a tool with an inside return antenna arrangement. For example, in some implementations, a logging tool 102b having a front return antenna arrangement can be easier to manufacture and service. As an example, in some implementations, antenna 502 is located along the outer periphery of magnetic core 304 and along the outer periphery of logging tool 102b. Thus, antenna 502 can be positioned after magnet 302 and magnetic core 304 have already been installed within logging tool 102b. Similarly, in some implementations, antenna 502 can be removed and/or replaced without requiring the removal of magnet 302 or magnetic core 304, making it easier to service or replace antenna 502.

Figure 7:
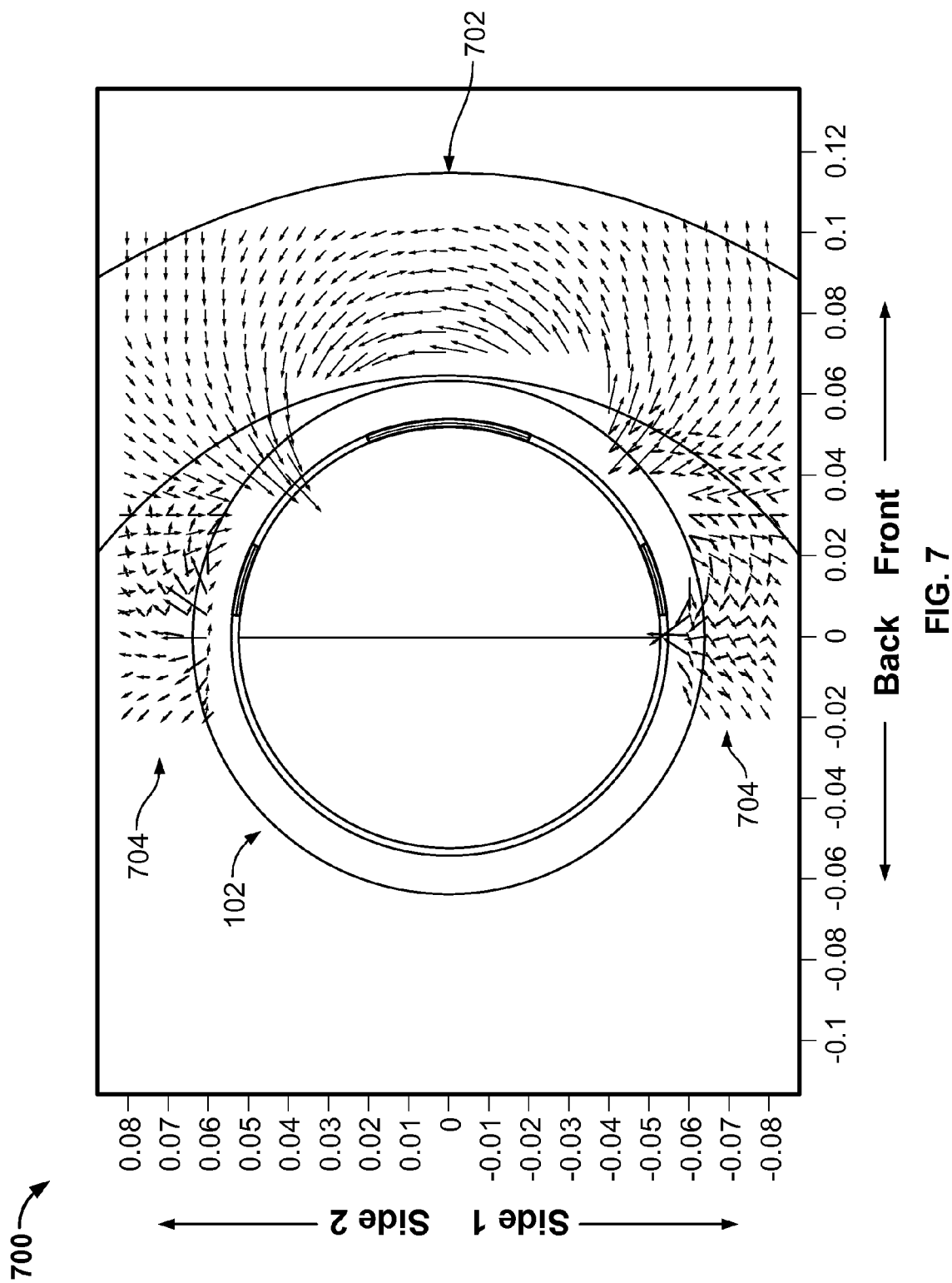
FIG. 7 is a plot of magnetic field strength induced by an example logging tool having a front return arrangement.
Figure 8:
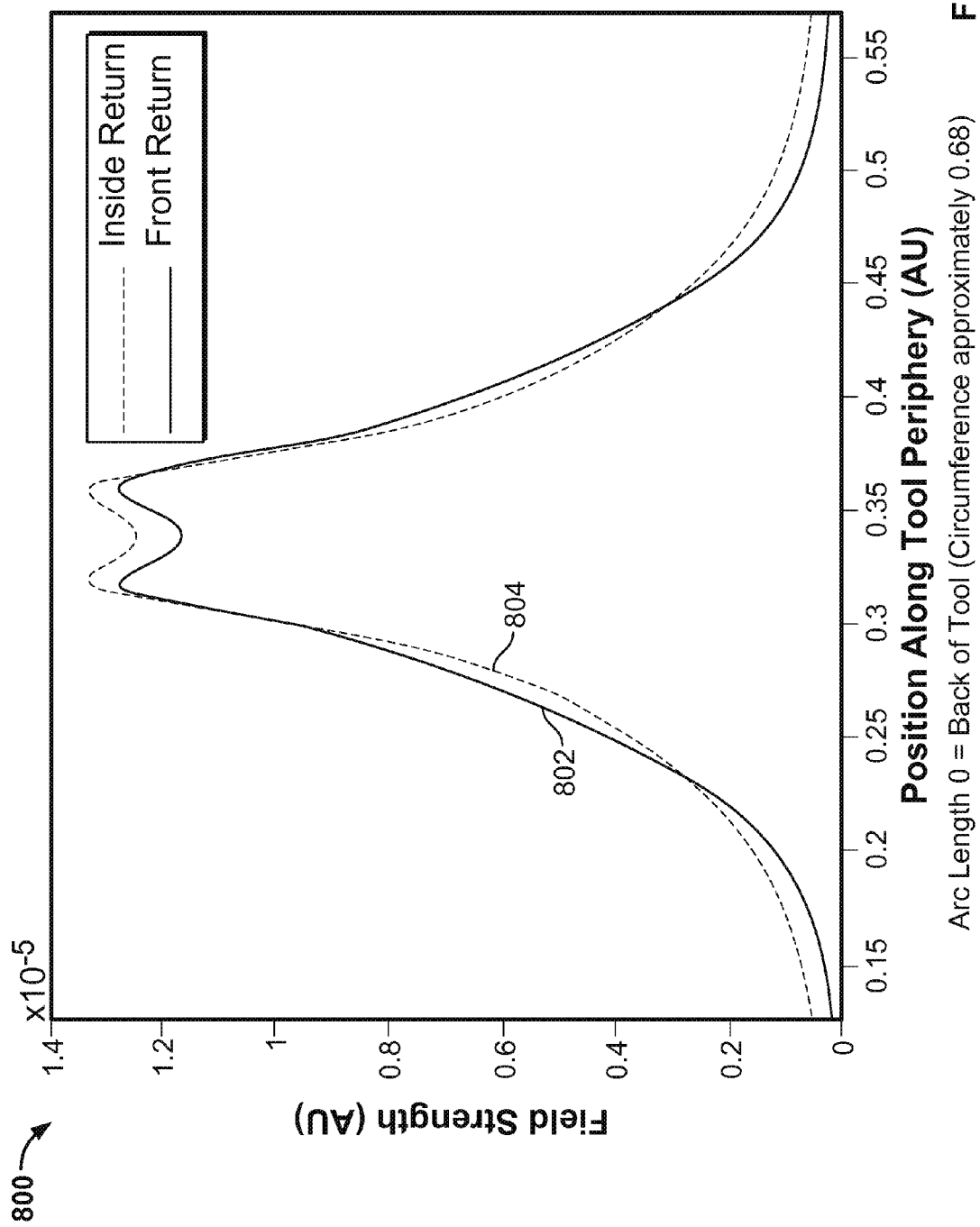
FIG. 8 is a plot comparing magnetic field strength induced by example logging tools having an inside return arrangement and a front return arrangement.

In some implementations, a tool with a front return antenna arrangement may induce an RF magnetic field (i.e., a $B_1$ magnetic field) that may be more beneficial for eccentric logging applications. For example, referring to FIG. 7, a plot 700 of the RF magnetic field induced by an example logging tool with a front return antenna arrangement shows that the magnetic field is relatively strong towards the front of tool 102b (illustrated as having longer field lines 702 towards the front region), while the $B_1$ magnetic field is relatively weaker towards the back and the sides of the tool 102b (illustrated as having shorter field lines towards the back and sides). This induced field strength can be compared to that induced by a tool with an inside return antenna arrangement. For example, FIG. 8 includes a plot 800 that shows the strength of RF magnetic fields induced by a tool having a front return antenna arrangement (line 802) and a tool having an inside return antenna arrangement (line 804) for an example antenna current of one amp. Plot 800 shows that a tool having a front return antenna arrangement induces a weaker magnetic field to the rear of the tool, compared to that induced by a tool having an inside return antenna arrangement. This can be beneficial in certain cases. In an example, if a logging tool 102b is an eccentric logging tool, the region to the rear of the tool may be of lesser interest to the operator than the region to the front of the tool. Thus, a front return antenna arrangement can be used to preferentially analyze volumes to the front of a logging tool. In another example, if logging tool is positioned within a borehole during MWD or LWD operations, the region to the rear of a logging tool may include fluids being pumped from the surface. In some implementations, the composition of these fluids may already been known, and there may be little value in analyzing these fluids. Further, in some implementations, these fluids may be salty, and may cause eddy currents that can introduce noise and artifacts to the NMR analysis. By reducing the $B_1$ magnetic field that is induced in these regions, the noise can be reduced and the signal to noise ratio (SNR) of the NMR measurements can be increased.

Thus, in some implementations, a front return antenna arrangement can be used to provide a preferred measurement direction by inducing a stronger RF magnetic field in a volume of interest for averaging closely to optimal (i.e., 90 degree) spin tipping, and thereby increasing the SNR of the NMR measurement. Similarly, in some implementations, a front return antenna arrangement can be used to detect NMR signals induced in a volume of interest with greater sensitivity.

Figure 9:
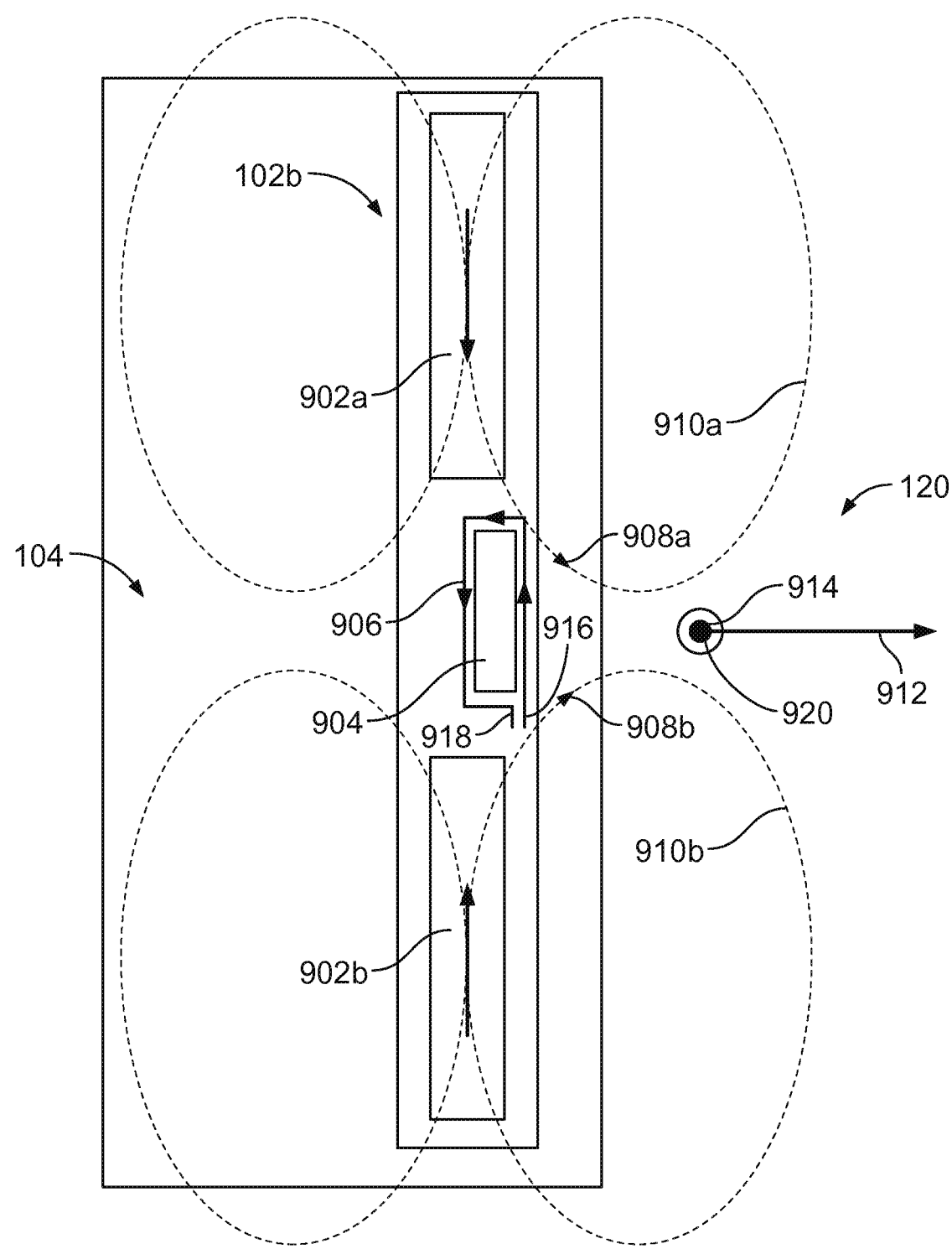
FIG. 9 is a diagram of another example logging tool positioned within a wellbore.

A number of implementations have been described. Nevertheless, it will be understood that various modifications are possible. For example, while the above example shows how example logging tools having radially arranged magnets and tangentially arranged antennas can be modified to have a "front return" antenna arrangement, tools having other arrangements of magnets and magnetically permeable magnetic cores can also be modified to have a front return antenna arrangement. For instance, FIG. 9 shows another example logging tool that can be modified to have a front return arrangement. The original arrangement of this example logging tool and its corresponding magnetic flux is shown in FIG. 9. As before, the spatial relationship between the logging tool and its induced magnetic flux is exaggerated, and is not drawn to scale. FIG. 9 depicts a longitudinal cross-section of an axially-extending eccentric logging tool 102b positioned within a wellbore 104, and used to directionally analyze the subterranean region 120 that surrounds the logging tool 102b. Logging tool 102b has an arrangement similar to a conventional Jasper-Jackson arrangement, and includes two magnets 902a and 902b, a magnetic core 904 made of a magnetically permeable material, and an antenna 906.

Magnets 902a-b can be used to induce the magnetic field $B_0$ in an NMR experiment. Magnets 902a-b have remnant fields 906a-b, respectively, that extend longitudinally towards magnetically permeable core 904, and induces magnetic flux, depicted in FIG. 9 as arrowheads 908a and 908b positioned along dotted lines 910a and 910b, respectively. This magnetic flux and magnetic field at a point 914 point with direction 912 within the subterranean region 120. The magnetic field, $B_0$, can be used in an NMR experiment.

Antenna 906 is a path of electrically conductive material wrapped around magnetic core 904. Antenna 906 carries a current I in order to induce an RF magnetic field $B_1$ in an NMR experiment, and is used to measure the NMR signal in response to the induced fields. Antenna 906 can be of various shapes. For instance, in some implementations, antenna 906 can define a loop. When a current I is applied to antenna 906 at input lead 916, current I flows outward from input lead 402 and returns to output lead 918, inducing magnetic flux. At point 914 within the subterranean region 120, the net RF magnetic flux induced by the current I in the antenna points perpendicular to the extension of the tool 102b (represented as arrow 920 pointing into the page), and is perpendicular to the net magnetic field $B_0$ induced by the magnets (represented by arrow 912). This RF magnetic field induced by the antenna can be used as the magnetic field $B_1$ in an NMR experiment.

In this example configuration, the "outward path" of antenna 906 (i.e., the segment that directs current I outward from input lead 402) is positioned along a first surface of magnetic core 304, while the "return path" of the antenna 906 (i.e., segment that returns current I back to the output lead 918) is positioned along a surface of magnetic core 304 opposite that of the outward path. This configuration is known as an "inside return." While current I is shown in FIG. 9 as flowing in a particular direction along antenna 906, in this configuration, the direction of current flow does not matter, and can be reversed.

Figure 10:
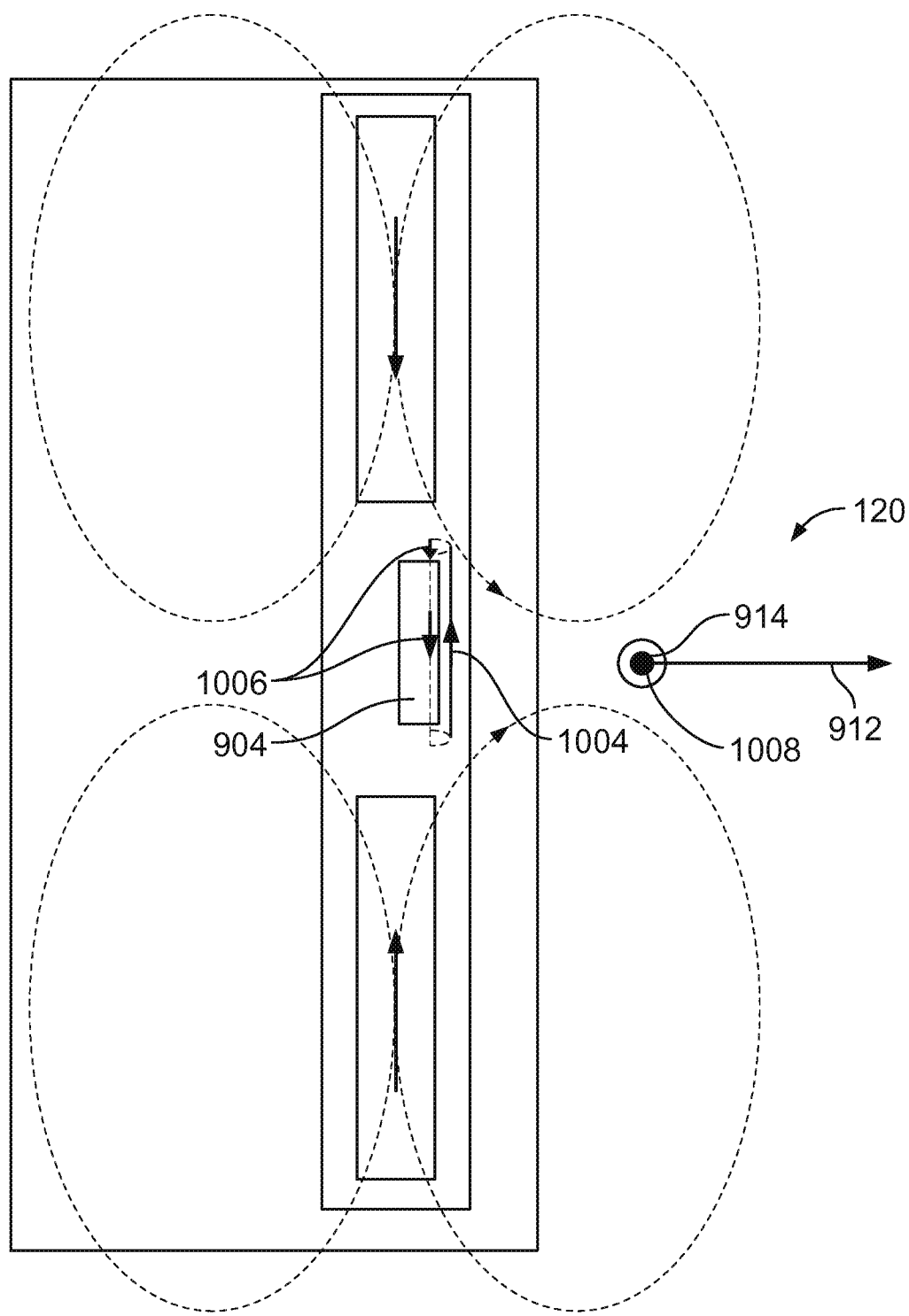
FIG. 10 is a diagram of another example logging tool positioned within a wellbore.

In a similar manner as described above, a "front return" arrangement can be used with this example logging tool. For example, referring to FIG. 10, antenna 906 can be replaced with an antenna 1002. In some implementations, antenna 1002 may be similar to antenna 502, and may include can include multiple loops defined by a centrally positioned common segment (defining an outward path from an input lead), and two other segments (defining return paths to an output lead). When a current I is applied to antenna 1002 at its input lead, current I flows outward from input lead in a first direction 1004 along its common segment, inducing magnetic flux. Current I also returns to the output lead by flowing in a second direction 1006, with the current I divided between the two segments return segments. This current I/2 in each return segment induces magnetic flux. This magnetic flux, at the point 914, points in direction 1008 within the subterranean region 120. This magnetic flux is the magnetic excitation field $B_1$ in an NMR experiment. As above, in this example, the spatial relationship between the logging tool and its induced magnetic flux is exaggerated, and is not drawn to scale.

In this example configuration, the "outward path" of antenna 1002 (i.e., the common segment that directs current I outward from input lead) is positioned along a surface of magnetic core 304 that faces the front of the tool 102, and the "return path" of the antenna 902 (i.e., the segments that return current I back to the output lead) is also positioned along a surface that faces the front of tool 102. This configuration is known as a "front return." In a similar manner as described above, this front return arrangement can has a directionally smoother field distribution along the sensitive volume arc of the RF magnetic field, such that a stronger magnetic field is in a volume of interest for a 90 degree tipping, and thus receives an increase the SNR of the NMR measurement.

While FIG. 6 shows a certain configuration of an antenna, in general, other configurations are also possible. For instance, referring to FIGS. 11A-B, example antennas 1100a-b may be similar to antenna 502. Antennas 1102a-b include a common segment 1102a that extends from an input lead 1104, two segments 1102b-c that extend parallel to common segment 1102a on each side of common segment 1102a, two segments 1102d-e that connect common segment 1102a to segments 1102b-c, respectively, and two segments 1102f-g that connect segments 1102d-c, respectively, to output lead 1106. These segments 1102a-g form two symmetric loops 1106a and 1106b. However, in FIG. 11A segments 1102b-c are longer than common segment 1102a. Alternatively, as shown in FIG. 11B, segments 1102b-c are shorter than common segment 1102a. Other antenna configurations can be used, for example antennas that include more loops (e.g., three, four, five, etc.), and/or antennas with different loops arrangements (e.g., rectangular loops, trapezoidal loops, parallelogram loops, polygonal loops, irregular loops, curved loops, etc.). In some implementations, antennas can define paths with different numbers of turns (e.g., one, two three, four, five, etc.).

In some implementations, antennas can be constructed from conductors of various shapes. For example, conductors can be round wire, square wire, flat ribbon conductors, foil conductors, or Litz wire.

In some implementations, antennas can include segments that are composed of multiple conductors (e.g., multiple electrically conductive wires or traces) that each carries current in a common direction. For example, in some implementations, common segment 502a of FIG. 6, 1102a of FIG. 11A, or 1102a of FIG. 11B can be composed of multiple current-carrying conductors that each carry current in parallel. These conductors can be made of electrically conductive materials such as copper, aluminum, gold, silver, or high temperature super conductors.

The techniques and systems described above can be implemented in digital electronic circuitry, or in computer software, firmware, or hardware, including the structures disclosed in this specification and their structural equivalents, or in combinations of one or more of them. For example, computing subsystem 110 can include an electronic processor that can be used to control one or more components of well system 100 or logging tool 102. In another example, an electronic processor can be used to analyze and process measurement data obtained by logging tool 102, for instance to estimate a characteristic of subsurface layers 122 or structures of well system 100, as described above.

The term "electronic processor" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Various aspects of the invention are summarized as follows:

In general, in an aspect, a nuclear magnetic resonance system for well logging using an axially-extending tool includes a magnet, a core having a first surface facing the magnet and one or more other surfaces facing away from the magnet, and an antenna positioned along at least one of the one or more other surfaces. The antenna includes a first loop of electrically conductive material and a second loop of electrically conductive material. The first and second loops include a common segment extending along an axis of the axially-extending tool.

Implementations of this aspect may include one or more of the following features:

In some implementations, the common segment can be positioned along a surface of the core opposite the magnet. The core can be between the magnet and the antenna.

In some implementations, the common segment can be positioned along a surface of the core that extends along the axis of the axially-extending tool. The tool can further include an additional magnet, where the core is between the magnet and the additional magnet.

In some implementations, the first loop and the second loop can be between the core and a point beyond the radial periphery of the tool. The system can include an electronic controller in communication with the magnet and the antenna assembly. The electronic controller can be programmed to cause the magnet to induce a first magnetic field at the point and to cause the antenna assembly to induce a radio frequency magnetic field at the point. The radio frequency magnetic field can be orthogonal to the first magnetic field at the point.

In some implementations, the first loop can be symmetric to the second loop.

In some implementations, the first loop can further include a first segment, the second loop can further include a second segment, the common segment can extend from a first trace, and the first segment and the second segment can converge into a second trace. The common segment can diverge to form the first segment and the second segment. The common segment, the first segment, and the second segment can extend axially from a notional arc, and the common segment can extends axially from a center of the arc. The first segment and the second segment can extend axially from positions on the arc a distance from the center of the arc. An angular distance between the common segment and the first segment can be in a range from about 80 degrees to about 85 degrees relative to a focus of the arc.

In some implementations, the one or more other surfaces can include a planar surface.

In some implementations, the one or more other surfaces can include a curved surface.

In some implementations, the core can be composed of a material having a relative magnetic permeability in a range from about 9 to 20.

In some implementations, the common segment can include a plurality of conductors that extend in a common direction.

In some implementations, the first magnetic field can be a static magnetic field.

In some implementations, the common segment can be disposed near a surface of the core opposite the magnet.

In some implementations, the first loop and the second loop can be disposed between the core and a volume beyond the radial periphery of the tool. The system can include an electronic controller in communication with the magnet and the antenna assembly. The electronic controller can be programmed to cause the magnet to induce a first magnetic field at the volume and to cause the antenna assembly to induce a radio frequency magnetic field at the volume. The radio frequency magnetic field can be orthogonal to the first magnetic field at the volume.

In general, in another aspect, a method includes obtaining an axially extending magnetic resonance well logging tool. The tool includes a magnet, and a core having a first surface facing the magnet and one or more other surfaces facing away from the magnet. The method also includes positioning an antenna along at least one of the one or more other surfaces. The antenna includes a first loop of electrically conductive material and a second loop of electrically conductive material. The first and second loops include a common segment extending along an axis of the axially-extending tool.

Implementations of this aspect may include one or more of the following features:

In some implementations, positioning the antenna can include positioning the common segment along a surface of the core opposite the magnet. Positioning the antenna can include positioning the antenna such that the core is between the magnet and the antenna.

In some implementations, positioning the antenna can include positioning the common segment along a surface of the core that extends along the axis of the axially-extending tool.

In some implementations, positioning the antenna can include positioning the first loop and the second loop between the core and a point beyond the radial periphery of the tool. The method can further include using the magnet to induce a first magnetic field at the point, and using the antenna assembly to induce a radio frequency magnetic field at the point. The radio frequency magnetic field can be orthogonal to the first magnetic field at the point.

In some implementations, the first loop can be symmetric to the second loop.

In some implementations, the first loop can further include a first segment, the second loop can further include a second segment, the common segment can extend from a first trace, and the first segment and the second segment can converge into a second trace. The common segment can diverge to form the first segment and the second segment. Positioning the antenna can include positioning the antenna such that the common segment, the first segment, and the second segment extend axially from a notional arc, and the common segment extends axially from a center of the arc. Positioning the antenna can include positioning the antenna such that the first segment and the second segment extend axially from positions on the arc a distance from the center of the arc. Positioning the antenna can include positioning the antenna such that an angular distance between the common segment and the first segment is in a range from about 80 degrees to about 85 degrees relative to a focus of the arc.

In some implementations, positioning the antenna can include positioning the common segment near a surface of the core opposite the magnet.

In some implementations, positioning the antenna can include positioning the first loop and the second loop between the core and a volume beyond the radial periphery of the tool. The method can further include using the magnet to induce a first magnetic field at the volume, and using the antenna assembly to induce a radio frequency magnetic field at the volume. The radio frequency magnetic field can be orthogonal to the first magnetic field at the volume.

Accordingly, other embodiments are within the scope of the following claims.

What is claimed is:

1. A nuclear magnetic resonance system for well logging using an axially-extending tool, the system comprising:
 a magnet;

a core having a first surface facing the magnet and one or more other surfaces facing away from the magnet; and
an antenna positioned along at least one of the one or more other surfaces, the antenna comprising a first loop of electrically conductive material and a second loop of electrically conductive material, the first and second loops comprising a common segment extending along an axis of the axially-extending tool.

2. The system of claim 1, wherein the common segment is positioned along a surface of the core opposite the magnet.

3. The system of claim 2, wherein the core is between the magnet and the antenna.

4. The system of claim 1, wherein the common segment is positioned along a surface of the core that extends along the axis of the axially-extending tool.

5. The system of claim 4, wherein tool further comprises an additional magnet;
wherein the core is between the magnet and the additional magnet.

6. The system of claim 1, wherein the first loop and the second loop are between the core and a point beyond the radial periphery of the tool.

7. The system of claim 6, comprising an electronic controller in communication with the magnet and the antenna assembly, the electronic controller being programmed to cause the magnet to induce a first magnetic field at the point and to cause the antenna assembly to induce a radio frequency magnetic field at the point, wherein the radio frequency magnetic field is orthogonal to the first magnetic field at the point.

8. The system of claim 1, wherein the first loop is symmetric to the second loop.

9. The system of claim 1, wherein
the first loop further comprises a first segment;
the second loop further comprises a second segment;
the common segment extends from a first trace; and
the first segment and the second segment converge into a second trace.

10. The system of claim 9, wherein the common segment diverges to form the first segment and the second segment.

11. The system of claim 9, wherein the common segment, the first segment, and the second segment extend axially from a notional arc, and the common segment extends axially from a center of the arc.

12. The system of claim 11, wherein the first segment and the second segment extend axially from positions on the arc a distance from the center of the arc.

13. The system of claim 12, wherein an angular distance between the common segment and the first segment is in a range from about 80 degrees to about 85 degrees relative to a focus of the arc.

14. The system of claim 1, wherein the one or more other surfaces comprise a planar surface.

15. The system of claim 1, wherein the one or more other surfaces comprise a curved surface.

16. The system of claim 1, wherein the core is composed of a material having a relative magnetic permeability in a range from about 9 to 20.

17. The system of claim 1, wherein the common segment comprises a plurality of conductors that extend in a common direction.

18. The system of claim 7, wherein the first magnetic field is a static magnetic field.

19. The system of claim 1, wherein the common segment is disposed near a surface of the core opposite the magnet.

20. The system of claim 1, wherein the first loop and the second loop are disposed between the core and a volume beyond the radial periphery of the tool.

21. The system of claim 20, comprising an electronic controller in communication with the magnet and the antenna assembly, the electronic controller being programmed to cause the magnet to induce a first magnetic field at the volume and to cause the antenna assembly to induce a radio frequency magnetic field at the volume, wherein the radio frequency magnetic field is orthogonal to the first magnetic field at the volume.

22. A method comprising:
obtaining an axially extending magnetic resonance well logging tool comprising:
a magnet; and
a core having a first surface facing the magnet and one or more other surfaces facing away from the magnet;
positioning an antenna along at least one of the one or more other surfaces, wherein the antenna comprises a first loop of electrically conductive material and a second loop of electrically conductive material, and the first and second loops comprise a common segment extending along an axis of the axially-extending tool.

23. The method of claim 22, wherein positioning the antenna comprises positioning the common segment along a surface of the core opposite the magnet.

24. The method of claim 23, wherein positioning the antenna comprises positioning the antenna such that the core is between the magnet and the antenna.

25. The method of claim 22, wherein positioning the antenna comprises positioning the common segment along a surface of the core that extends along the axis of the axially-extending tool.

26. The method of claim 22, wherein positioning the antenna comprises positioning the first loop and the second loop between the core and a point beyond the radial periphery of the tool.

27. The method of claim 26, further comprising:
using the magnet to induce a first magnetic field at the point; and
using the antenna assembly to induce a radio frequency magnetic field at the point;
wherein the radio frequency magnetic field is orthogonal to the first magnetic field at the point.

28. The method of claim 22, wherein the first loop is symmetric to the second loop.

29. The method of claim 22, wherein the first loop further comprises a first segment;
the second loop further comprises a second segment;
the common segment extends from a first trace; and
the first segment and the second segment converge into a second trace.

30. The method of claim 29, wherein the common segment diverges to form the first segment and the second segment.

31. The method of claim 29, wherein positioning the antenna comprises positioning the antenna such that the common segment, the first segment, and the second segment extend axially from a notional arc, and the common segment extends axially from a center of the arc.

32. The method of claim 31, wherein positioning the antenna comprises positioning the antenna such that the first segment and the second segment extend axially from positions on the arc a distance from the center of the arc.

33. The method of claim 32, wherein positioning the antenna comprises positioning the antenna such that an angular distance between the common segment and the first segment is in a range from about 80 degrees to about 85 degrees relative to a focus of the arc.

34. The method of claim 22, wherein positioning the antenna comprises positioning the common segment near a surface of the core opposite the magnet.

35. The method of claim 22, wherein positioning the antenna comprises positioning the first loop and the second loop between the core and a volume beyond the radial periphery of the tool.

36. The method of claim 35, further comprising:
   using the magnet to induce a first magnetic field at the volume; and
   using the antenna assembly to induce a radio frequency magnetic field at the volume;
   wherein the radio frequency magnetic field is orthogonal to the first magnetic field at the volume.

\* \* \* \* \*